(12) United States Patent
Tripp et al.

(10) Patent No.: US 6,615,379 B1
(45) Date of Patent: Sep. 2, 2003

(54) METHOD AND APPARATUS FOR TESTING A LOGIC DEVICE

(75) Inventors: Michael J. Tripp, Forest Grove, OR (US); James W. Alexander, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/457,255

(22) Filed: Dec. 8, 1999

(51) Int. Cl.[7] .......................... G01R 31/28; G01R 31/26
(52) U.S. Cl. ...................................... 714/736; 324/765
(58) Field of Search .................................. 714/703, 732, 714/737, 738, 741, 744, 736, 819, 820, 824, 28; 324/763, 764, 765

(56) References Cited

U.S. PATENT DOCUMENTS 6,055,661 A * 4/2000 Luk ........................... 714/736
6,452,411 B1 * 9/2002 Miller et al. ................ 324/765

* cited by examiner

*Primary Examiner*—Albert Decady
*Assistant Examiner*—Matthew C. Dooley
(74) *Attorney, Agent, or Firm*—Schwegman, Lundberg, Woessner & Kluth, P.A.

(57) ABSTRACT

Method and apparatus provides for testing a device or system with a pattern generator. A series of predetermined test vectors are stored, and, for at least some of the test vectors, an associated predetermined MISR signature. A test vector is applied to a device or system under test and a gold unit in response to a gating signal, the test vector having an associated MISR determined by simulating the expected result vector. In response thereto, the gold unit and the device or system under test each produce a result vector which are compared to detect errors in the performance of the system or device under test. A MISR signature is generated for the result vector from the gold unit. The MISR signature for the result vector is then compared to the MISR associated with the input test vector. If the signatures do not match, further test vectors are prevented from being applied to the device or system under test. If the signatures match, a gating signal is provided so that additional test vectors are applied to the device or system under test.

12 Claims, 3 Drawing Sheets

METHOD AND APPARATUS FOR TESTING A LOGIC DEVICE

TECHNICAL FIELD OF THE INVENTION

The present invention pertains generally to testing electronic components, and more particularly to a system for testing logic devices with an event generator producing a test pattern.

BACKGROUND OF THE INVENTION

As electronic devices or systems become more complex, testing becomes increasingly difficult due to the large number of potential faults and failure modes. One method of testing such systems is applying a series of test vectors using a pattern or event generator, and comparing the result output by the system under test with an expected result. The expected result may be obtained from a simulation of the system under test, or by use of a "gold" standard unit or system that is determined to be fault free. One problem, however, is that a variance from expected performance by the gold standard system will cause the entire test sequence to fail.

SUMMARY OF THE INVENTION

Thus, it is advantageous if such a variance can be quickly detected so that the error can be remedied quickly, or at least more easily diagnosed. Accordingly, there is a need for method and apparatus for testing that can help detect variance of the gold standard system from expected behavior more quickly.

The present invention provides method and apparatus for testing electronic systems. According to one example embodiment, predetermined test vectors are stored with an associated multiple input signature register (MISR) signature, wherein the MISR signature for a test vector is the expected signature of the output of a gold unit in response to the test vector. The actual MISR signature of the output is compared with the expected MISR signature to detect variances from expected behavior, and interrupt testing so that failure analysis may be done. This and various other embodiments of the invention are described below.

DETAILED DESCRIPTION OF THE INVENTION

Figure 1:
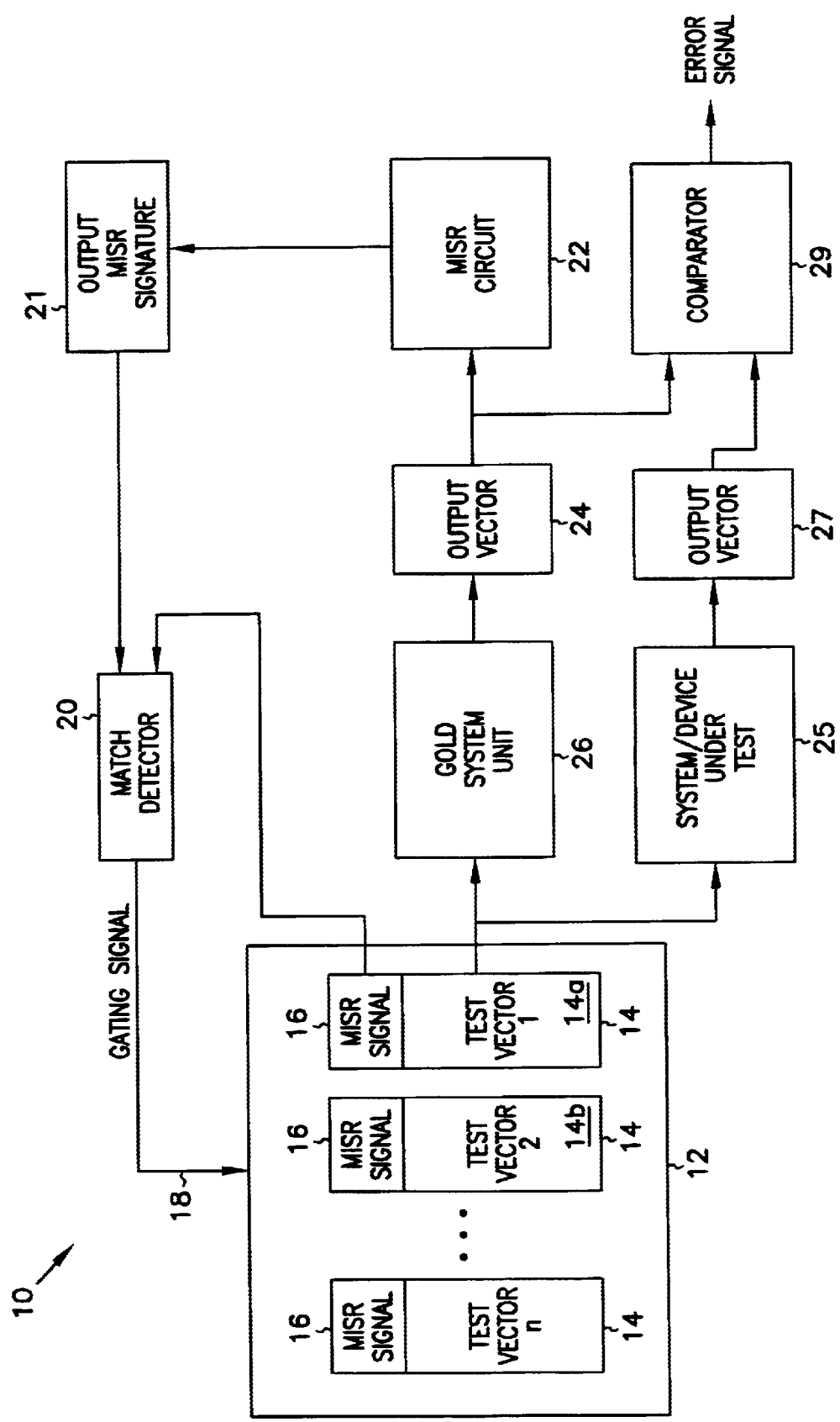
FIG. 1 illustrates an example embodiment of the method and apparatus for testing an electronic system or device according to the present invention.

In the following detailed description of the invention reference is made to the accompanying drawings which form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention.

Referring now to FIG. 1 there is illustrated method and apparatus according to a first example embodiment of the invention. A test system 10 includes a test pattern generator 12 storing a series of predetermined test vectors 14 and, for at least some of the test vectors, an associated predetermined multiple input signature register (MISR) signature 16. The test pattern generator 12 outputs a series of test vectors, each based on a specific clock cycle count. Upon a certain clock cycle, for example, a test vector 14a is asserted. A subsequent test vector 14b is next asserted based on a specific clock cycle and, in accordance with one example embodiment of the invention, in response to a gating signal 18. In operation, test vector 14 is applied to a gold system or unit 26 and a system/device under test 25. The gold unit 26 and the system/device under test 25 each output as output vectors 24 and 27, respectfully, which are compared in comparator 29, which generates an error signal in the event of a mismatch indicating a failure of the system/device under test 25, or, possibly, a failure or aberration in the expected performance of the gold unit 26.

When the gold unit 26 is operating properly, gating signal 18 is generated by a match detection circuit 20 and testing progresses. Circuit 20 compares the MISR signature 16 associated with the applied test vector 14 with a MISR signature 21 generated by a MISR circuit 22. The MISR circuit 22 receives a result vector 24 from the gold unit 26, wherein the result vector 24 is formed from the output signals from unit 26 produced in response to the input test vector 14. MISR circuit 22 is an output data compactor which compresses and stores the state of a set of bus signals. This compressed state of the set of signals forms a MISR signature. When a match of the MISR signals is detected, a gating signal 18 is produced, allowing a subsequent test vector to be applied. If a mismatch is detected, the gating signal is withheld, and no further input test vectors are applied to the gold unit 26 or system/device 25 under test.

Figure 2:
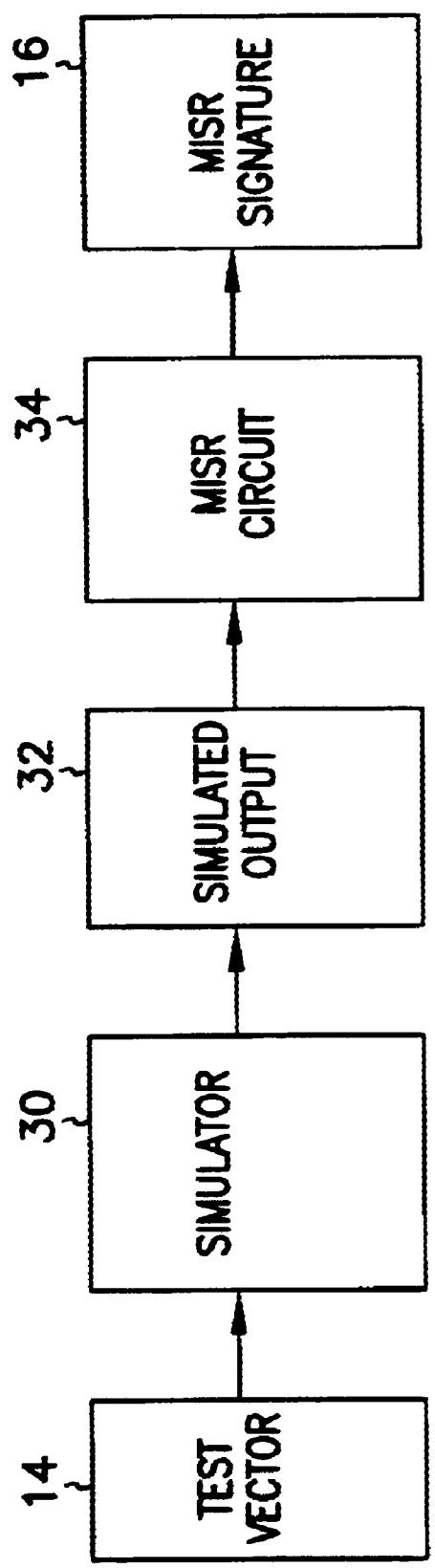
FIG. 2 illustrates an example embodiment for determining a multiple input signature register (MISR) signature according to the method and apparatus of the present invention.

The MISR signature 16 associated with each test vector 14 is generated according to the method illustrated in FIG. 2. As illustrated, each MISR signature 16 is generated by first applying a test vector 14 to a simulator 30, which simulates the expected output 32 of the gold unit 26. The simulated output 32 is applied to a MISR circuit or simulator 34, which in turn produces a MISR signature 16 for each output 32. The MISR signature 16 is then associated with the test vector 14. Accordingly, in operation, as described above, the gold unit 26 produces an output which, when applied to the MISR circuit 22, produces a MISR signature 21, which, if the gold unit 26 is operating as simulated and expected, matches the predetermined signature 16.

According to one example embodiment, the pattern generator 12 is a cycle based event generator and each test vector is applied to a bus connected to device or system 26. Further, the bus is clocked, and each test vector is asserted on the bus in accordance with the bus clock cycles.

Figure 3:
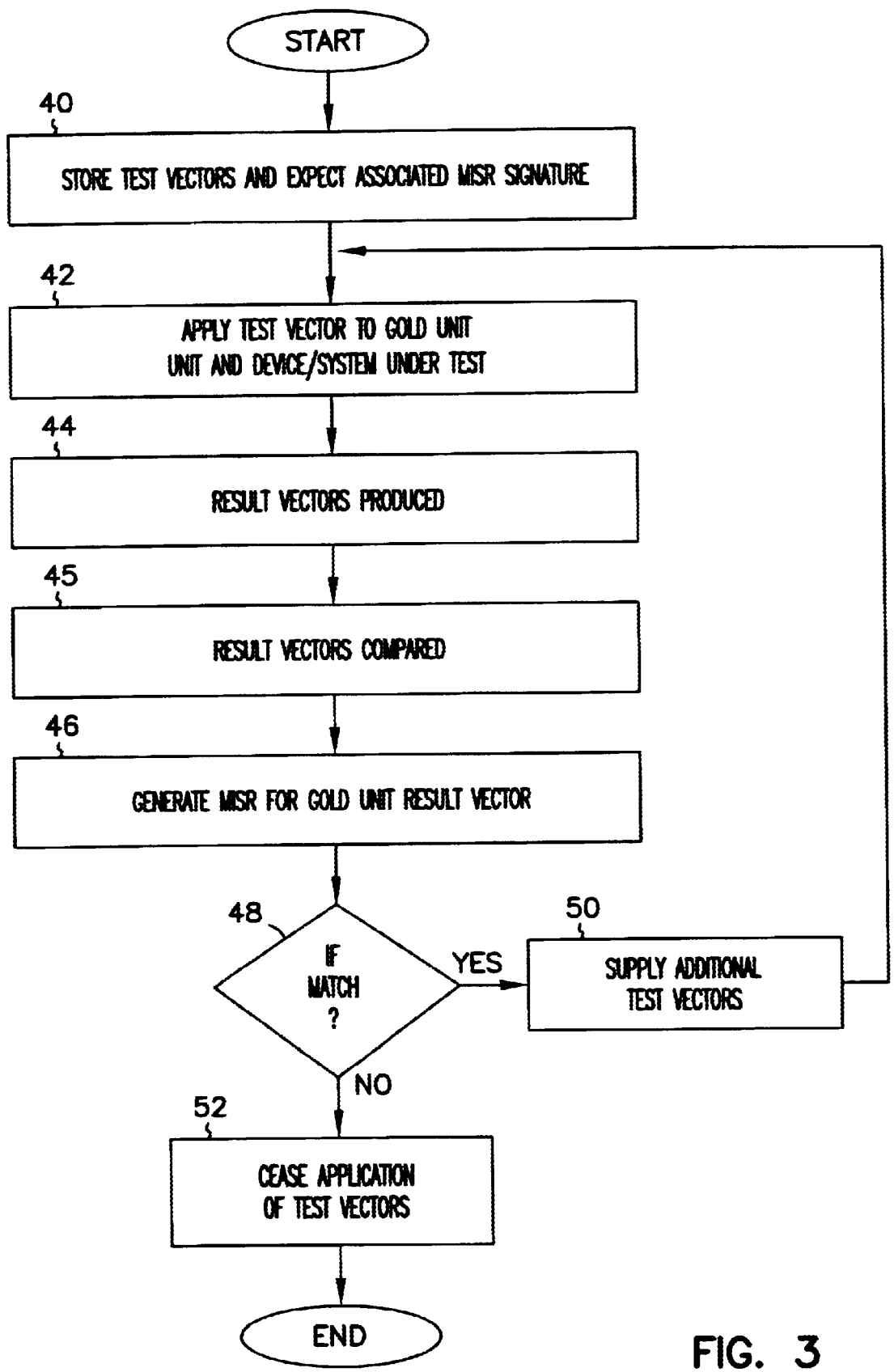
FIG. 3 illustrates yet another embodiment of the method of the present invention.

Referring now to FIG. 3, there is illustrated a flow chart of an example embodiment of the test method according to the present invention. The method provides for storing a series of predetermined test vectors and, for at least some of the test vectors, an associated predetermined MISR signature (40). Next, a test vector is applied to a gold unit and a device or system under test in response to a gating signal, the test vector having an associated MISR determined by simulating the expected result vector (42). In response thereto, the gold unit and the device or system under test each produce a result vector (44) and the result vectors compared (45) to determine if the device or system under test is functioning as expected, as compared to the gold unit. A MISR signature is also generated for the result vector from the gold unit (46). The MISR signature for the result vector is then compared to the MISR associated with the input test vector (48). If the signatures do not match, further test vectors are prevented from being applied to the device or system under test (52). If the signatures match, a gating signal is provided so that additional test vectors are applied to the device or system under test (50). It shall be understood that the exact order of the above-described steps may be varied while still achieving the desired result of gating the application of test vectors Thus, the above described system provides that any discrepancy between expected behavior and actual behavior of the gold unit 26 can be immediately identified. In addition, the test pattern generator 12 may be inhibited from asserting further inputs to the gold unit 26 and the device/system 25 under test, and thereby preserve the integrity of the system as it existed at the point of departure from expected behavior. In addition, by identifying mismatches close to the time of occurrence, the time required to identify the root cause of the failure is shortened, as the states between expected and unexpected behavior are fewer than if the behavioral mismatch were detected later in the test procedure. Further, by interrupting the test procedure quickly following the behavioral departure, catastrophic failure of the gold unit and/or the device under test may be avoided, thus simplifying failure analysis. Further, other resources used in the test procedure may also be protected from corruption, and eliminate the need to reinitialize the entire test setup or platform for each search, further speeding up the debug process.

What is claimed is:

1. A test system comprising:
    a test pattern generator adapted to store a series of predetermined test vectors and, for at least some of the test vectors, an associated signature, and adapted to output a test vector to a "gold" standard unit and a unit under test when a gating signal is applied thereto;
    a signal generating circuit adapted to receive output signals from the gold unit, the output signals forming a series of result vectors, and adapted to output a signature for at least some of the result vectors;
    a match detection circuit adapted to receive a signature from the test pattern generator and a corresponding signature from the signal generating circuit, and adapted to output the gating signal when the signatures match; and
    a comparator to compare the output signals from the "gold" standard unit and output signals from the unit under test.

2. A system according to claim 1 further wherein the test pattern generator includes a counter and the generated test vectors are adapted to output in accordance with a count kept by the counter.

3. A system according to claim 1 wherein the associated signatures and the output signatures are multiple input signature register signatures representing a compressed state of a set of signals.

4. A system according to claim 1 wherein the pattern generator is a cycle based event generator.

5. A system according to claim 4 further including a bus and wherein the pattern generated is adapted to apply each test vector to the bus, and wherein the bus is connected to gold unit.

6. A system according to claim 5 further including a clock adapted to provide a bus clock signal to the bus, so that the test vectors are applied to the bus upon the occurrence of the bus clock signal.

7. A test method comprising:
    storing a series of predetermined test vectors and, for at least some of the test vectors, an associated predetermined signature;
    applying a test vector to a gold unit and a device or system under test in response to a gating signal, the test vector having an associated signature determined by simulating an expected result vector;
    the gold unit producing a result vector in response to the applied test vector;
    generating a signature for the result vector;
    comparing the signature for the result vector to the signature associated with the input test vector;
    if the signatures do not match, preventing further test vectors from being applied to the gold unit and the device or system under test, and if the signatures match, providing a gating signal so that additional test vectors are applied to the device or system under test.

8. A method according to claim 7 further wherein test vectors are output in accordance with a count kept by a counter.

9. A method according to claim 8 wherein the associated signatures and the generated signatures are multiple signature input register signatures representing a compressed state of a set of signals.

10. A method according to claim 7 wherein the test vectors are produced by a cycle based event generator.

11. A method according to claim 10 wherein each test vector is applied to a bus connected to the gold unit.

12. A method according to claim 11 further wherein test vectors are applied to the bus upon the occurrence of a bus clock signal.

* * * * *